(12) United States Patent
Ikegami

(10) Patent No.: US 7,029,957 B2
(45) Date of Patent: *Apr. 18, 2006

(54) METHOD OF MANUFACTURING SEMICONDUCTOR DEVICE HAVING THIN FILM SOI STRUCTURE

(75) Inventor: Naokatsu Ikegami, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 57 days.

This patent is subject to a terminal disclaimer.

(21) Appl. No.: 10/625,544

(22) Filed: Jul. 24, 2003

(65) Prior Publication Data

US 2005/0019991 A1    Jan. 27, 2005

Related U.S. Application Data

(63) Continuation of application No. 10/320,507, filed on Dec. 17, 2002, now Pat. No. 6,624,010.

(30) Foreign Application Priority Data

Dec. 18, 2001  (JP) .............................. 2001-384956

(51) Int. Cl.
 *H01L 21/00*   (2006.01)
(52) U.S. Cl. ....................... 438/149; 438/161
(58) Field of Classification Search ................ 438/149, 438/161, 165
See application file for complete search history.

(56) References Cited

U.S. PATENT DOCUMENTS

| | | | |
|---|---|---|---|
| 6,331,486 B1 * | 12/2001 | Cabral et al. | 438/682 |
| 6,624,010 B1 * | 9/2003 | Ikegami | |
| 6,664,598 B1 * | 12/2003 | Dennard et al. | 257/347 |
| 6,800,513 B1 * | 10/2004 | Horiuchi et al. | 438/157 |

OTHER PUBLICATIONS

"Deep Sub-0.1 μm MOSFET's with very thin SOI layer for ultra-low power consumption", C-II vol. J81-C-II No. 3, pp 313-319 published in Mar., 1998 by The Institute of Electronics, Information and Communication Engineers Author: Makoto Takamiya, Yuri Yasuda and Toshiro Hiramoto Note: English Summary is attached.

"Optimization of Series Resistance in Sub-0.2 mm SOI MOSFET's", IEEE Electron device letters, vol. 15, No. 09 p. 363 published in Sep., 1994 Author: Lisa T. Su, Melanie J. Sherony, Hang Hu, James E. Chung and Dimitri A. Antonidis.

* cited by examiner

*Primary Examiner*—Roy Potter
(74) *Attorney, Agent, or Firm*—Junichi Mimura

(57) ABSTRACT

A method of manufacturing a semiconductor device includes the steps of, (1) preparing an SOI substrate, (2) forming a metal layer on the SOI substrate, (3) performing a first anneal treatment to the metal layer at a relatively low temperature in order to transform the metal layer to a first silicide layer, (4) forming an insulating layer on the first silicide layer, and (5) forming a contact hole, which reaches the first silicide layer, in the insulating layer; and (6) performing a second anneal treatment to the silicide layer at a relatively high temperature in order to transform the first silicide layer to a second silicide layer.

12 Claims, 3 Drawing Sheets

METHOD OF MANUFACTURING SEMICONDUCTOR DEVICE HAVING THIN FILM SOI STRUCTURE

CROSS-REFERENCE TO RELATED APPLICATION

This application claims the priority benefit of Japanese Patent Application No. 2001-384956, filed Dec. 18, 2001, the entire disclosure of which is incorporated herein by reference. This application is a continuation of applicant's application Ser. No. 10/320,507, filed Dec. 17, 2002 now U.S. Pat. No. 6,624,010.

BACKGROUND OF THE INVENTION

1. Field of the Invention

The invention relates to a method of manufacturing a semiconductor device, specifically to a method of manufacturing a semiconductor device having a thin film SOI structure in which imperceptible contact holes are formed.

2. Description of the Related Art

With an increase in the level of a high performance, an SOI-type semiconductor device is generally used in order to satisfying the requirement, instead of a semiconductor device having a bulk silicon substrate. The SOI-type semiconductor device includes an SOI substrate, which consists of a support substrate, a buried silicon oxide layer (BOX layer) and a silicon layer (SOI layer) formed on the BOX layer, and field effect transistors (FETs) are formed in the silicon layer. Thus, this type of the semiconductor device is called SOI (Silicon On Insulator) type semiconductor device.

According to the SOI-type semiconductor device, since the FETs are formed in a thin SOI layer formed on a BOX layer, a junction capacitance can be reduced, comparing to the semiconductor device having the bulk silicon substrate. As a result, high speed performance can be expected in such a SOI-type semiconductor device. Further, it is easy to isolate electrically each FET because the FETs are formed on the thin SOI layer. Specifically, the FETs are formed on the thin SOI layer, these FETs become fully depleted FETs. Thus, each fully depleted FET has small parasitic capacitance so that sub-threshold swing in the SOI-type semiconductor device becomes smaller than that in the semiconductor device having the bulk silicon substrate. As a result, the SOI-type semiconductor device draws attention as a low power consumption device. Moreover, since the width of the depletion region of each FET at its channel is determined by the thickness of the thin SOI layer, it is possible to control the short channel effect.

To perform the fully depleted operation of the SOI-type semiconductor device, it is required that the thickness of the SOI layer be reduced, with the progress of development of imperceptible device. For example, as shown in a thesis "Deep Sub-0.1 μm MOSFET's with very thin SOI layer for ultra-low power consumption", C-II vol. J81-C-II No. 3, pp 313–319 published in 1998 by The Institute of Electronics, Information and Communication Engineers, the shorter the gate length is, like 0.35 μm, 0.25 μm, and 0.18 μm, the thinner the thickness of the SOI layer is, like 60 nm, 50 nm, and 40 nm. In the generation that the gate length is 0.1 μm, it is required that the thickness of the SOI layer be less than 20 nm.

When the thickness of the SOI layer becomes thinner, an operation ability using current may be decreased because the parasitic resistance at diffusion layers such as source and drain layers, increases. To avoid this issue, a silicide layer, such as a $TiSi_x$ layer or a $CoSi_x$ layer, is formed on the source and drain, whereby it is possible to reduce the resistance value. If the $CoSi_x$ layer is selected, three possible formations can be considered: one is $Co_2Si$, another is $CoSi$, and the other is $CoSi_2$. Since $CoSi_2$ has the lowest resistance value among them, the $CoSi_2$ layer may be selected and is selectively formed on the SOI substrate by the following process.

First, a Co layer is formed on the thin SOI layer. Then, a first anneal treatment is performed in the atmosphere of 550° C. for 30 seconds, and a second anneal treatment is performed in the atmosphere of 700° C. for 60 seconds successively. By performing the first and the second anneal treatments under the condition described above, the $CoSi_2$ layer can be formed consistently. The process of forming a $CoSi_2$ layer are reported in "Optimization of Series Resistance in Sub-0.2 mm SOI MOSFET's", IEEE Electron device letters, Vol. 15, No. 09 Page 363 published in 1994.

However, the thinner the SOI layer is, the lesser the amount of silicon in the SOI layer to be consumed is. As a result, when the silicide layer is formed with using the thin SOI layer, it is difficult to control the composition in order to form the silicide layer consistently. Further, since the thickness of the SOI layer is reduced gradually by factors presented in each of the process steps before silicidation, it is further difficult to control the composition in order to form the silicide layer. As a result of this difficulty, a localized thin regions or defect spots of silicided SOI (void) may be formed during the $CoSi_2$ silicidation process at the second anneal treatment. Specifically, since it is generally found that the SOI layer is thinner in some areas (it is called "local thinning"), there is strong possibility that voids are preferentially formed in this areas during silicidation of the SOI layer. In the successive process for forming a contact hole in an insulating layer, which is formed on the silicide layer, when the contact holes are formed at the areas where the voids are formed, the contact holes reach the BOX layer underneath the silicide layer via voids. Since the BOX layer is formed of the same material (SiO2) of the insulating layer, the contact hole may reaches to the support substrate easily in case of the over-etching, resulting in the formation of threading pinholes through the BOX layer at the contact opening. In other words, the BOX layer can not stop etching for forming the contact hole because the insulating layer and the BOX layer are formed of the same material. As a result, a process yield (hereinafter referred as a BOX yield) is dramatically decreased.

SUMMARY OF THE INVENTION

An objective of the invention is to resolve the above-described problem and to provide a method of forming a semiconductor device, which avoid reaching a contact hole to a support substrate of a SOI substrate through a BOX layer.

The objective is achieved by a method of manufacturing a semiconductor device, including the steps of, (1) preparing an SOI substrate, (2) forming a metal layer on the SOI substrate, (3) performing a first anneal treatment to the metal layer at a relatively low temperature in order to transform the metal layer to a first silicide layer, (4) forming an insulating layer on the first silicide layer, and (5) forming a contact hole, which reaches the first silicide layer, in the insulating layer; and (6) performing a second anneal treatment to the silicide layer at a relatively high temperature in order to transform the first silicide layer to a second silicide layer.

BRIEF DESCRIPTION OF THE DRAWINGS

The invention will be more particularly described with reference to the accompanying drawings, in which.

DETAILED DESCRIPTION OF THE PREFERRED EMBODIMENTS

In each drawing, the same reference numbers designate the same or similar components.

Figure 1A:
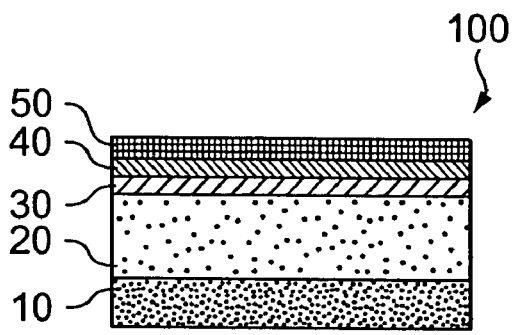
FIGS. 1A through 1H are sectional views showing successive stages in manufacturing an SOI-type semiconductor device.

FIGS. 1A through 1H shows successive stages in manufacturing an SOI-type semiconductor device 100. Referring to FIG. 1A, a buried silicon oxide layer (BOX layer) 20 is formed on an entire surface of a support substrate 10 made of silicon. Then, a silicon-on-insulator layer (SOI layer) 30 is formed on an entire surface of the BOX layer 20. An SOI substrate consists of the support substrate, the BOX layer and the SOI layer. Then, a cobalt layer (Co layer) 40 having an appropriate thickness is formed on the SOI layer 30 by a conventional sputtering method. After forming the Co layer 40, a titanium nitride layer (TiN layer) 50 is formed on the Co layer 40 by a conventional sputtering method. The TiN layer 50 acts as a cap layer to protect the reaction of the Co layer 40 with the SOI layer from the atmosphere in a successive silicidation process.

Figure 1B:
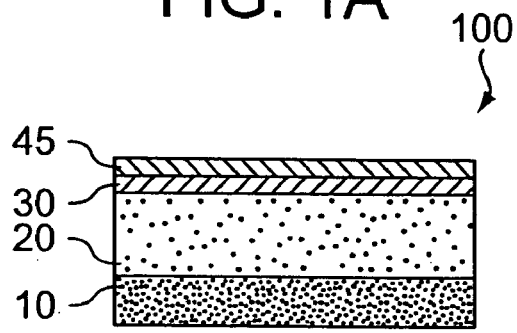

Referring to FIG. 1B, a first anneal treatment is performed to the SOI-type semiconductor device 100 in the range between 450° C. and 550° C., preferably 550° C. for thirty (30) seconds whereby a CoSi silicide layer 45 is formed as a result of a reaction of the SOI layer 30 and the Co layer 40. Here, 450° C. is the minimum temperature in order to form the CoSi silicide layer 45, and 550° C. is the maximum temperature to avoid forming any voids in the silicide layer 45 by using to much silicon in the SOI layer 30. Then, an unreacted part of the Co layer 40 and the TiN layer 50 are removed by a wet etching method.

Figure 1C:
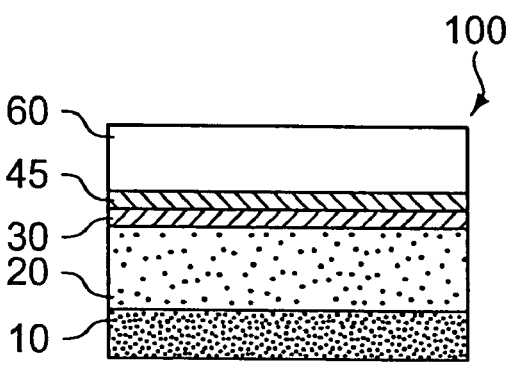

Referring to FIG. 1C, a plasma $SiO_2$ layer 60, which as an interlayer oxide film, is, then, formed on the CoSi silicide layer 45 under the condition in the range between 400° C. and 550° C., preferably 440° C. The temperature range for forming the plasma $SiO_2$ layer 60 is relatively lower than that for forming a LP-TEOS $SiO_2$ layer, which is generally formed in the atmosphere around 700° C. Here, 450° C. is the minimum temperature in order to form the plasma $SiO_2$ layer 60, and 550° C. is the maximum temperature to avoid forming any voids in the silicide layer 45 as described above.

FIGS. 1D through 1H shows successive stages in forming an imperceptible mask pattern in order to form a contact hole in the SOI-type semiconductor device 100. With an increase in high integration of a system LSI, a size of the contact hole formed in an interlayer is getting smaller. In the generation that the gate length is 0.1 μm, it is required to form a contact hole having less than 0.1 μm at its diameter, which is out of the resolution limit of a KrF photolithography. To satisfy this requirement, a couple of techniques are proposed for mass production purpose. One of these techniques is a method of making a contact hole by SAC (Self Aligned Contact) etching after a hole pattern whose size is resolutionable by photolithography is formed in a resist layer. Another is a method of making a contact hole whose diameter at the bottom is reduced less than 0.1 μm by a taper etching method. The other is an introduction of mask shrink processes. Specifically, according to the mask shrink process using poly-silicon (Poly-Si), it is possible to make an imperceptible contact hole less than 0.1 μm consistently.

Figure 1D:
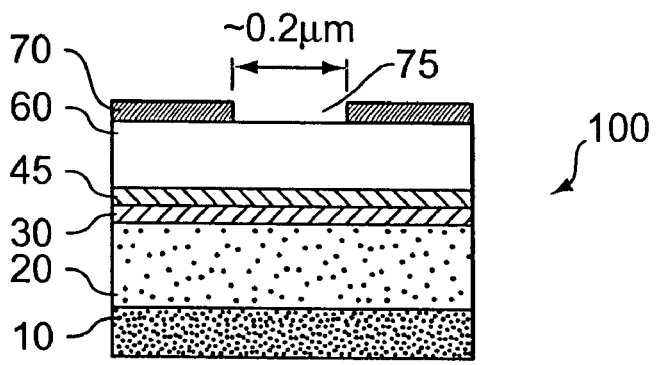

As described above, FIGS. 1D through 1H shows successive stages in forming an imperceptible mask pattern in order to form a contact hole patterns in the SOI-type semiconductor device 100. Specifically, the poly-Si mask shrink process is applied to these successive stages. As shown in FIG. 1D, a first poly-Si layer 70, which acts as a mask, is formed on the entire surface of the plasma $SiO_2$ layer 60. Then, a hole pattern 75 having a width less than 0.2 μm is formed in the first poly-Si layer 70 by the conventional KrF photolithography and the dry etching technology. Generally, the resolution limit of the KrF photolithography is approximately 0.2 μm.

Figure 1E:
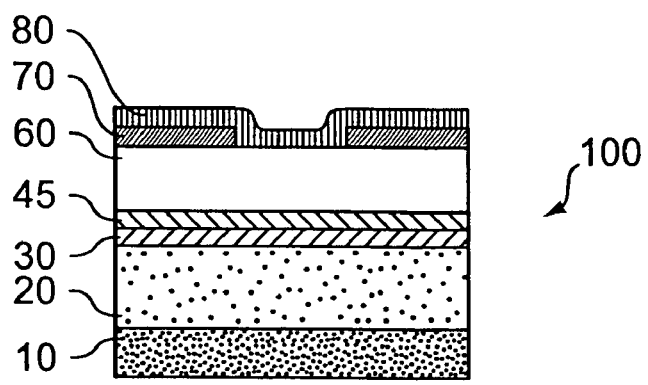

Referring to FIG. 1E, a second poly-Si layer 80 is, then, deposited on the first poly-Si layer 70 and in the hole pattern 75. The thickness of the first poly-Si layer 70 is determined by the depth of the contact hole. Deeper the contact hole is formed, thicker the first poly-Si layer 70 is required. However, when the first poly-Si layer 70 is formed thick too much, the etching for making a contact hole may stop accidentally. Thus, in this embodiment, the thickness of the first poly-Si layer 70 is set at less than 5000 Å, preferably 3000 Å. On the other hand, the thickness of the second poly-Si layer 80 is determined by the width of the contact hole. In this embodiment, since the width of the contact hole is set at 0.1 μm, the thickness of the second poly-Si layer 80 is set at 1000 Å.

The first and second poly-Si layers 70, 80 are formed in the same material and under the same condition. Thus, the quality of them are the same. When the quality of the first and second poly-Si layers 70, 80 are the same, these layers can be etched out uniformly.

Figure 1F:
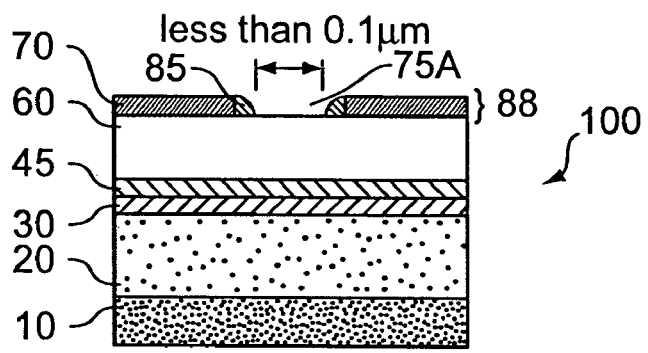

Then, referring to FIG. 1F, the second poly-Si layer 80 is etched out by an anisotropical etching so that a poly-Si side-wall spacer 85 is formed at the internal surface of the hole pattern 75. According to this method, since the poly-Si side-wall spacer 85 is formed in the hole pattern 75, the size of the actual contact hole 75A is less than 0.1 μm, which is smaller than the resolution limit. According to this step, a poly-Si mask 88 formed by the first poly-Si layer 70 and the poly-Si side-wall spacer 85 is completed.

As described above, the first and the second poly-Si layers 70, 80 are deposited in the range between 400° C. and 550° C., preferably 540° C., which is less than 620° C. at which a poly-Si layer is generally formed in this field. Depositing the first and the second poly-Si layers 70, 80 under this condition avoids forming any voids of the CoSi silicide layer 45 while the quality of the first and the second poly-Si layers 70, 80 is maintained.

Figure 1G:
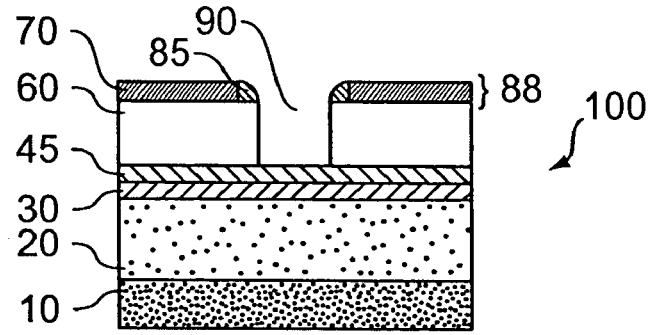

Next, referring to FIG. 1G, a contact hole 90, which reaches the CoSi silicide layer 45, is formed in the plasma $SiO_2$ layer 60 by using the poly-Si mask 88. Generally, a poly-Si layer, which is deposited in the atmosphere less than 620° C., is in amorphous state. Thus, the resistance of such a poly-Si layer to the dry etching, which is generally used in this field, is not sufficient acting as a mask. For this reason, the dry etching using the amorphous state poly-Si mask 88 for forming the contact hole 90 is performed under the condition below.

Etching device: Dipole ring magnetically enhanced reactive ion etching system

Gas condition: $C_4F_8/O_2/Ar$=20/10/500 sccm, 40 mTorr, 1600W or $CHF_3/CO$=30/170 sccm, 35 mTorr, 1600W It is confirmed that the amorphous state poly-Si layer deposited in the atmosphere less than 620° C. has dry etching resistance enough to form the contact hole having a width of 0.1 μm when the dry etching is performed under the condition described above.

Figure 1H:
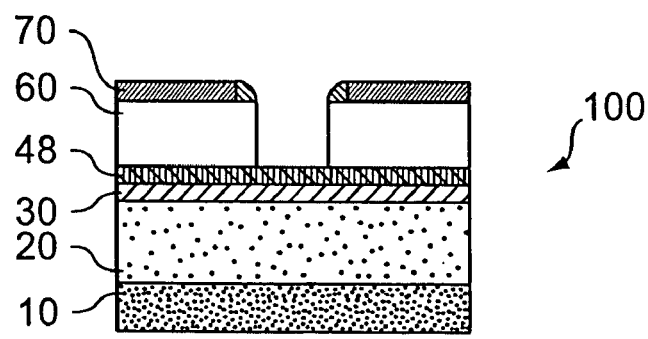

Next, referring to FIG. 1H, after the contact hole 90 is formed, a second anneal treatment, that is a rapid thermal anneal, is performed to the SOI-type semiconductor device 100 in the atmosphere of 800° C. for thirty (30) seconds so that the CoSi silicide layer 45 is transformed to $CoSi_2$ silicide layer 48. Generally, the CoSi silicide layer 45 itself shown in FIG. 1B, which is formed in the atmosphere of 550° C., is not suitable for applying it to a semiconductor device because of its high specific resistance. For this reason, it is necessary to perform the second anneal treatment, as shown in FIG. 1H.

According to the invention, this second anneal treatment is performed after the contact hole 90 is formed, as described above. On the other hand, as described in the description of the related art, the second anneal treatment is performed just after the first anneal treatment. When the second anneal treatment is performed just after the first anneal treatment, some voids are formed in the $CoSi_2$ layer because silicon in the SOI layer 30 is further consumed by reaction for transforming to $CoSi_2$ from CoSi. Thus, the contact hole 90 may reaches to the BOX layer 20 when the contact hole 90 is formed in the plasma $SiO_2$ layer 60 on an area where the void is formed in the $CoSi_2$ layer 48. Since the plasma $SiO_2$ layer 60 is formed of the same material of the BOX layer 20, the contact hole 90 may reaches to the support substrate 10 by accidental over-etching. However, according to the invention, since the second anneal treatment is performed after the contact hole 90 is formed, there is no voids formed in the CoSi layer 45 wherever the contact hole 90 is formed. Thus, it is possible to avoid reaching the contact hole 90 to the BOX layer 20 when the contact hole 90 is formed. After the second anneal treatment, some voids may be formed in the $CoSi_2$ layer 48. However, since the contact hole 90 has been formed at this stage, the contact hole 90 does not contact to the support substrate 10.

Figure 2:
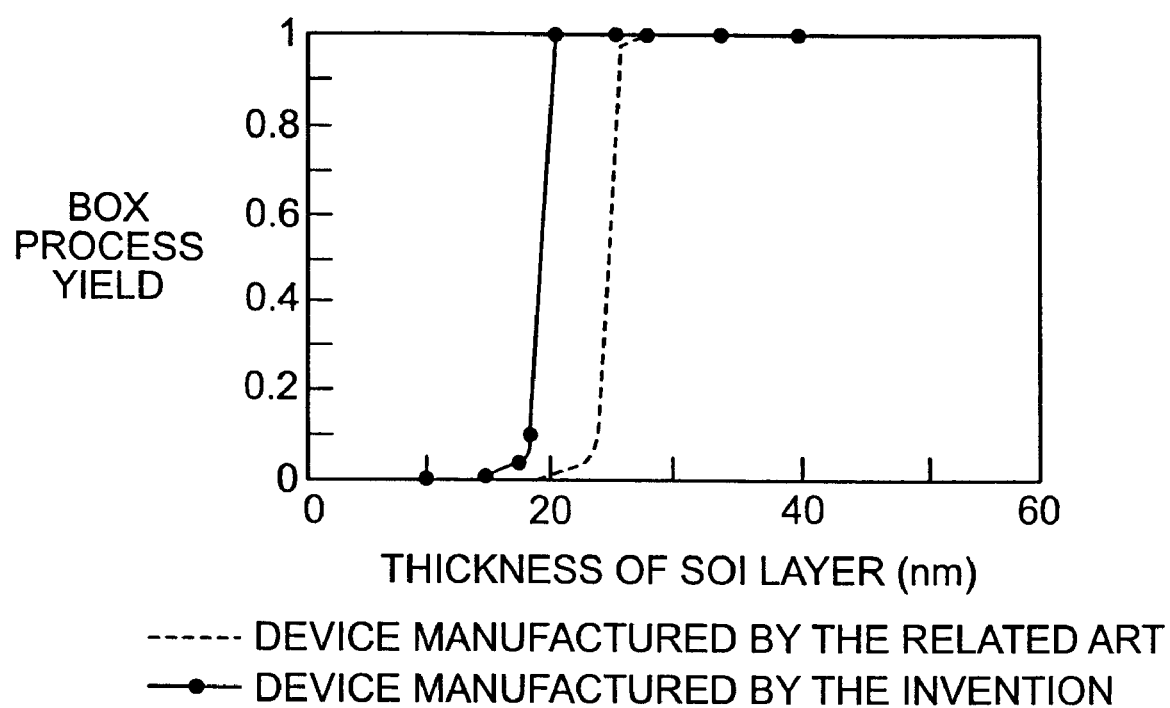
FIG. 2 is a graph showing a BOX yield.

FIG. 2 shows experiment results regarding a BOX yield of the thin film SOI-type semiconductor device. In FIG. 2, the thin film SOI-type semiconductor device manufactured by the process described above and the thin film SOI-type semiconductor device manufactured by the process of the related arts are compared. Further, by changing the thickness of the SOI layer of both semiconductor devices, a BOX yield of both semiconductor devices can be compared. As shown in FIG. 2, in the case that the thickness of the SOI layer is formed at 20 nm, a BOX yield can be 100%, which means no defectives, in the device formed by the invention. On the other hand, a BOX yield is 0%, which means all defectives, in the device formed by the related art.

According to the invention, since all process steps before forming the contact hole 90 are performed under 550° C., it is possible to avoid forming voids in the silicide layer. Thus, it is possible to increase the BOX yield dramatically. Further, since the second anneal for transforming the CoSi layer 45 to the $CoSi_2$ layer 48 is performed after the contact hole 90 is formed, there is no voids formed in the CoSi layer 45 when the contact hole 90 is formed. Thus, the contact hole does not reach to the BOX layer 20. As the result, it is possible to reduce the BOX defects when the contact hole 90 is formed.

While the invention has been described with reference to illustrative embodiments, this description is not intended to be construed in a limiting sense. Various other modifications of the illustrated embodiment will be apparent to those skilled in the art on reference to this description. Therefore, the appended claims are intended to cover any such modifications or embodiments as fall within the true scope of the invention.

I claim:

1. A method of manufacturing a semiconductor device, comprising:
   preparing an SOI substrate;
   forming a metal layer on the SOI substrate;
   annealing the metal layer at a first temperature, which is effective in converting the metal layer into a first silicide layer;
   forming an insulating layer on the first silicide layer; and
   forming a hole from a surface of the insulating layer until a part of the first silicide layer is exposed; and
   annealing the first silicide layer at a second temperature, which is effective in converting the first silicide layer into a second silicide layer by a rapid thermal annealing process wherein the second temperature is higher than the first temperature.

2. A method as claimed in claim 1 wherein the metal layer includes cobalt.

3. A method as claimed in claim 2 wherein the first silicide layer includes CoSi.

4. A method as claimed in claim 3 wherein the second silicide layer includes $CoSi_2$.

5. A method as claimed in claim 1 wherein annealing the metal layer is carried out at a temperature in a range between about 450° C. and about 550° C.

6. A method as claimed in claim 1 wherein annealing the metal layer is carried out at a temperature of about 550° C. for about 30 seconds.

7. A method as claimed in claim 1 wherein the rapid thermal annealing is carried out at a temperature of about 800° C.

8. A method as claimed in claim 1 wherein the SOI substrate has a thickness of 50 nm or less.

9. A method as claimed in claim 1 wherein the hole has a diameter of 0.1 □m or less.

10. A method as claimed in claim 1 wherein a time period of annealing the metal layer is shorter than that of annealing the first silicide layer.

11. A method as claimed in claim 1 wherein a difference between the first temperature and the second temperature is 350° C. or less.

12. A method as claimed in claim 1 wherein a resistance value of the first silicide layer is higher than that of the second suicide layer.

* * * * *